US012706471B2

(12) United States Patent
Kouda et al.

(10) Patent No.: US 12,706,471 B2
(45) Date of Patent: Aug. 11, 2026

(54) INFORMATION PROCESSING DEVICE, PROGRAM, AND METHOD

(71) Applicant: Sony Group Corporation, Tokyo (JP)

(72) Inventors: Michitomo Kouda, Tokyo (JP); Masahiko Naito, Tokyo (JP); Kento Takura, Tokyo (JP); Kumiko Tsukahara, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 814 days.

(21) Appl. No.: 17/774,862

(22) PCT Filed: Nov. 12, 2019

(86) PCT No.: PCT/JP2019/044416

§ 371 (c)(1),
(2) Date: May 6, 2022

(87) PCT Pub. No.: WO2021/095140

PCT Pub. Date: May 20, 2021

(65) Prior Publication Data

US 2022/0407334 A1 Dec. 22, 2022

(51) Int. Cl.

*H02J 7/90* (2026.01)
*G01R 31/382* (2019.01)
*H02J 7/82* (2026.01)

(52) U.S. Cl.

CPC ............ *H02J 7/933* (2026.01); *G01R 31/382* (2019.01); *H02J 7/82* (2026.01); *H02J 7/971* (2026.01); *H02J 7/977* (2026.01)

(58) Field of Classification Search

CPC ................. H02J 7/00712; H02J 7/0048; H02J 7/007188; H02J 7/007194; G01R 31/382

(Continued)

(56) References Cited

U.S. PATENT DOCUMENTS 11,599,172 B2 * 3/2023 Jung ......................... G06F 1/26
2008/0057894 A1 * 3/2008 Aleksic ............ H04W 52/0258 455/187.1

(Continued)

FOREIGN PATENT DOCUMENTS

CN 101211211 A 7/2008
CN 104104135 A 10/2014

(Continued)

OTHER PUBLICATIONS

International Search Report and Written Opinion mailed on Jan. 7, 2020, received for PCT Application PCT/JP2019/044416, Filed on Nov. 12, 2019, 9 pages including English Translation.

(Continued)

*Primary Examiner* — Julian D Huffman
*Assistant Examiner* — John P Ondrasik
(74) *Attorney, Agent, or Firm* — XSENSUS LLP

(57) ABSTRACT

There is a demand for an information processing device capable of maintaining, as long as possible, a state in which a decrease an the processing speed of a CPU due to heat generation hardly occurs. Therefore, proposed is an information processing device including a secondary battery, and the information processing device includes a measurement unit that measures a remaining amount of the secondary battery, a determination unit that determines whether or not the remaining amount is equal to or more than a first threshold and determines whether or not a specific application is in a foreground state, and a charge control unit that stops charging the secondary battery by using an external power supply in a case where the remaining amount is equal to or more than the first threshold and the specific application is in the foreground state.

18 Claims, 10 Drawing Sheets

(58) Field of Classification Search
USPC .......................................................... 320/150
See application file for complete search history.

(56) References Cited

U.S. PATENT DOCUMENTS

2008/0084189 A1* 4/2008 Kim ........................ G06F 1/263 320/160
2010/0223480 A1* 9/2010 Fratti ...................... H04L 12/10 713/300
2012/0239949 A1* 9/2012 Kalyanasundaram ...................... G06F 1/3212 713/320
2013/0147282 A1* 6/2013 Sakamoto ............... H02J 50/80 307/104
2015/0022154 A1* 1/2015 Kim ........................ H02J 7/007 320/114
2016/0064958 A1* 3/2016 Jung ................. H02J 7/007192 320/134
2019/0141243 A1* 5/2019 Ichikawa ................ G06F 1/263
2020/0203958 A1* 6/2020 Raikar .................... H02J 7/977
2020/0358302 A1* 11/2020 Kramar ............... H02J 7/00302

FOREIGN PATENT DOCUMENTS

CN 106340691 A 1/2017
CN 106356580 A 1/2017
CN 106450534 A * 2/2017 ............ H01M 10/44
CN 108604814 A 9/2018
CN 110429696 A * 11/2019 ............ H02J 7/0013
EP 3189506 A1 7/2017
JP 2004288536 A 10/2004
JP 2005-333794 A 12/2005
JP 2007-281911 A 10/2007
JP 2009-290906 A 12/2009
JP 2012034448 A 2/2012
JP 2014-512797 A 5/2014
JP 2016019379 A 2/2016
JP 2018-153251 A 10/2018
JP 2019-500828 A 1/2019
JP 2019-87891 A 6/2019
TW 201212469 A 3/2012

OTHER PUBLICATIONS

Zhao Jiong et al., “Research and Development of Strategic Emerging Industries in China”, Jun. 30, 2019, Mechanical Industry Press.
Xu Xuedong, “Computer Application Fundamentals Windows Edition”, China Railway Press, Jun. 30, 1998.
Zhang Xingwei, “Phone Repair Technology Training Course, Part 2”, Guangdong Science and Technology Press , Sep. 30, 2001.

* cited by examiner

REMAINING AMOUNT OF SECONDARY BATTERY (%)
100
50
FIRST THRESHOLD
0
d
e
f
TIME
SPECIFIC APPLICATION
FOREGROUND
SLEEP OR THE LIKE
CONNECTION OF EXTERNAL POWER SUPPLY
NONE
CONNECTED
CHARGE CONTROL MODE
CHARGE MODE
POWER SUPPLY MODE
CHARGE MODE

INFORMATION PROCESSING DEVICE, PROGRAM, AND METHOD

CROSS-REFERENCE TO RELATED APPLICATION

The present application is based on PCT filing PCT/JP2019/044416, filed Nov. 12, 2019, the entire contents of which are incorporated herein by reference.

FIELD

The present disclosure relates to an information processing device, a program, and a method.

BACKGROUND

When performing charging while operating a mobile terminal such as a smartphone or a tablet personal computer (PC), an information processing device such as a digital camera, or the like, both a central processing unit (CPU) and a charging circuit generate heat. In particular, when high-load processing such as capturing or distributing a video, game operation, and the like and charging are simultaneously executed, the internal temperature of the information processing device increases significantly.

Therefore, some conventional information processing devices have a function of suppressing an increase in the internal temperature by, for example, reducing the processing speed of the CPU when the internal temperature approaches an unsafe temperature that causes a low-temperature burn of the user or deterioration of the information processing device.

CITATION LIST

Patent Literature

Patent Literature 1: JP 2014-512797 A
Patent Literature 2: JP 2019-500828 A
Patent Literature 3: JP 2005-333794 A
Patent Literature 4: JP 2019-87891 A
Patent Literature 5: JP 2007-281911 A

SUMMARY

Technical Problem

However, a decrease in the processing speed of the CPU leads to the occurrence of so-called processing failure in which processing halts or is delayed. In particular, the higher the load of the processing, the more easily the processing failure occurs. Such processing failure in a game operation, video distribution, or the like in which a large amount of high-load processing is performed becomes a large factor that detracts a comfortable user experience and is a phenomenon that the user does not want to occur.

Therefore, the present disclosure proposes an information processing device, a program, and a method capable of maintaining, as long as possible, a state in which a decrease in the processing speed of a CPU due to heat generation hardly occurs.

Solution to Problem

According to the present disclosure, an information processing device including a secondary battery is provided that includes: a measurement unit that measures a remaining amount of the secondary battery; a determination unit that determines whether or not the remaining amount is equal to or more than a first threshold and determines whether or not a specific application is in a foreground state; and a charge control unit that stops charging the secondary battery by using an external power supply in a case where the remaining amount is equal to or more than the first threshold and the specific application is in the foreground state.

Moreover, according to the present disclosure, a program is provided that causes an information processing device including a secondary battery to execute processing of: measuring a remaining amount of the secondary battery; determining whether or not the remaining amount is equal to or more than a first threshold; determining whether or not a specific application is in a foreground state; and stopping charging the secondary battery by using an external power supply in a case where the remaining amount is equal to or more than the first threshold and the specific application is in the foreground state.

Moreover, according to the present disclosure, a method is provided in which an information processing device including a secondary battery executes processing of: measuring a remaining amount of the secondary battery; determining whether or not the remaining amount is equal to or more than a first threshold; determining whether or not a specific application is in a foreground state; and stopping charging the secondary battery by using an external power supply in a case where the remaining amount is equal to or more than the first threshold and the specific application is in the foreground state.

DESCRIPTION OF EMBODIMENTS

Figure 1:
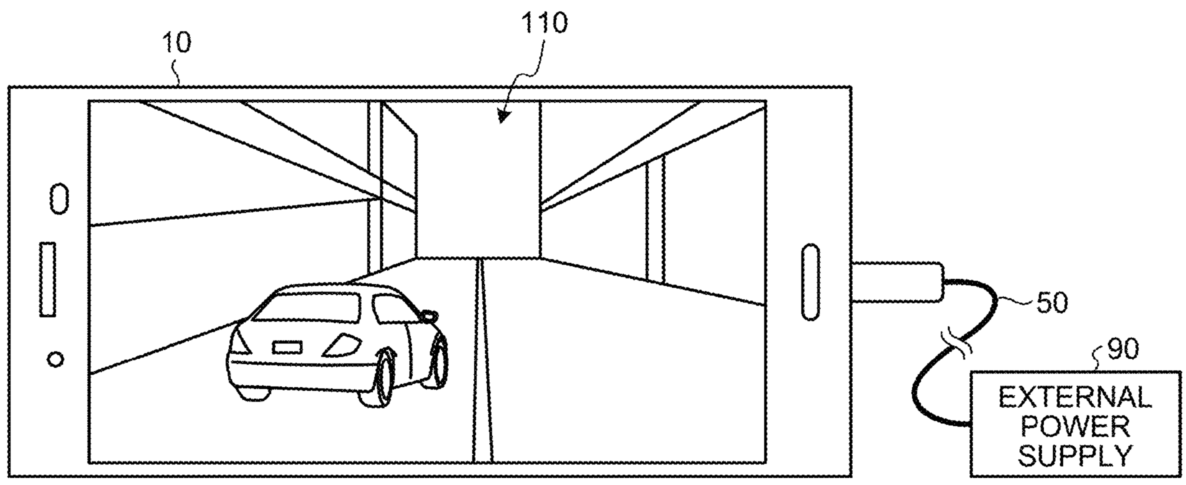
FIG. 1 is a diagram illustrating an example of an information processing device 10 according to the present embodiment.

Hereinafter, embodiments of the present disclosure will be described in detail with reference to the drawings. Note that, in the present specification and the drawings, substantially the same parts are denoted by the same reference numerals, and redundant description will be omitted.

Note that the description will be given in the following order.

1. Embodiment
1.1. Example of Functional Configuration
1.2. Details of Function
1.3. Flow of Function
2. Modification Example of Embodiment
3. Example of Hardware Configuration
4. Summary

1. Embodiment

1.1. Example of Functional Configuration

First, an information processing device 10 according to the present embodiment will be described. The information processing device 10 may be a mobile terminal such as a smartphone, a tablet PC, or the like capable of executing various applications, or may be a stationary terminal installed at a user's home, company, or the like. The information processing device 10 includes a secondary battery (also referred to as a storage battery, a battery, or a rechargeable battery). The information processing device 10 can operate for a certain period of time without supplying power from an external power supply (such as an AC adapter, mobile battery, or the like) by charging the secondary battery.

FIG. 1 is a diagram illustrating an example of the information processing device 10 according to the present embodiment. The example of FIG. 1 illustrates that a game application is displayed on a display unit 110 of the information processing device 10 and the game application is in a foreground state. In addition, the information processing device 10 is connected to an external power supply 90 via a cable 50. Note that, in a case where the external power supply 90 is directly connected to the information processing device 10, the cable 50 is not required. When the state illustrated in FIG. 1 is realized by a conventional device, high-load processing by a game application and charging are simultaneously executed. As a result, the internal temperature of the device significantly increases, which causes a decrease in the processing speed of the CPU.

Figure 2:
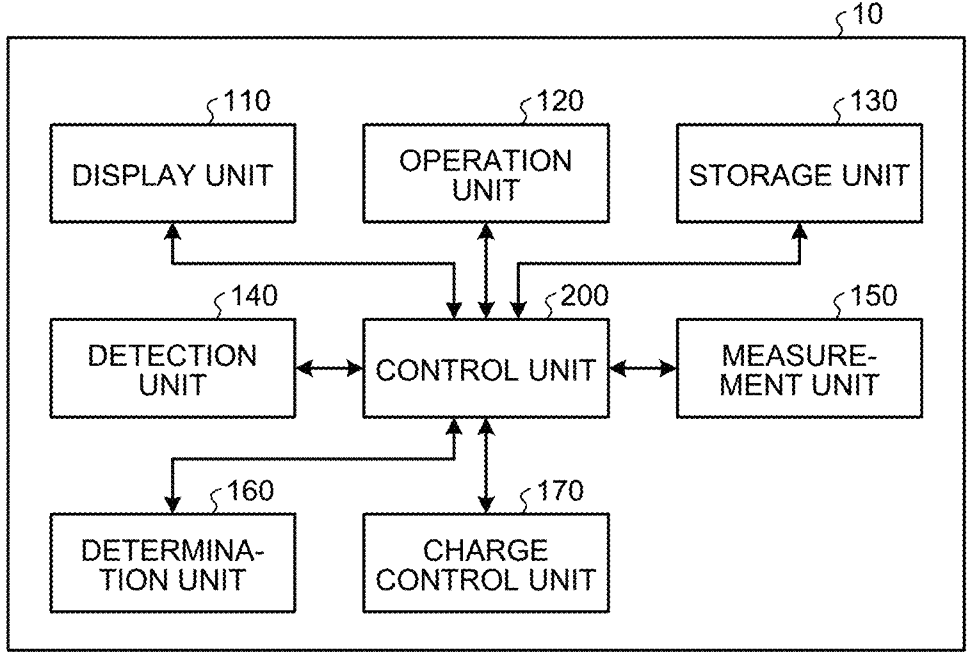
FIG. 2 is a block diagram illustrating an example of a functional configuration of the information processing device 10 according to the present embodiment.

FIG. 2 is a block diagram illustrating an example of a functional configuration of the information processing device 10 according to the present embodiment. As illustrated in FIG. 2, the information processing device 10 according to the present embodiment includes the display unit. 110, an operation unit 120, a storage unit 130, a detection unit 140, a measurement unit 150, a determination unit 160, a charge control unit 170, and a control unit 200.

(Display Unit 110)

The display unit 110 according to the present embodiment displays various types of visual information based on control by the control unit 200. The display unit 110 according to the present embodiment may display, for example, an image, a character, or the like related to an application. For this purpose, the display unit 110 according to the present embodiment includes various display devices such as a liquid crystal display (LCD) device, an organic light emitting diode (OLED) display device, or the like. In addition, the display unit 110 can also display a user interface (UI) of an operating system or another application on a layer higher than the screen of the application being displayed in a superimposing manner.

(Operation Unit 120)

The operation unit 120 according to the present embodiment detects various operations by the user, such as a device operation for an application. The device operation described above includes, for example, a touch operation and the like. Here, the touch operation refers to various touch operations on the display unit 110, such as tapping, double-tapping, swiping, pinching, and the like. In addition, the touch operation includes an operation of bringing an object such as a finger or the like close to the display unit. 110, for example. The operation unit 120 according to the present embodiment includes, for example, a touch panel, a button, a keyboard, a mouse, a proximity sensor, and the like. The operation unit 120 according to the present embodiment inputs information regarding the detected operation of the user to the control unit 200.

(Storage Unit 130)

The storage unit 130 according to the present embodiment is a storage area for temporarily or permanently storing various programs and data. For example, the storage unit 130 may store programs and data for the information processing device 10 to execute various functions. As a specific example, the storage unit 130 may store a program for executing various applications, management data for managing various settings and the like, and the like. Of course, the above description is merely an example, and the type of data stored in the storage unit 130 is not particularly limited.

(Detection Unit 140)

The detection unit 140 according to the present embodiment monitors and detects various changes serving as triggers for executing the charge control processing according to the present embodiment. The detection unit 140 according to the present embodiment detects, for example, that remaining amount of the secondary battery has become equal to or more than a predetermined threshold or has become less than the predetermined threshold. Note that the detection unit 140 only needs to monitor the remaining amount of the secondary battery and detect that a condition is satisfied with respect to a preset threshold, and can also detect, for example, that the remaining amount has become equal to or less than the threshold or that the remaining amount has exceeded the threshold. That is, it can be said that whether to set a condition including a threshold. (such as equal to or more than, equal to or less than, and the like) or a condition not including a threshold. (such as less than, above, below, and the like) is merely a range of design change.

In addition, the detection unit 140 detects that a specific application has become a foreground state, has become a sleep state, and has ended. In the sleep state, the application is not completely stopped and background processing may be executed, but the detection unit 140 can also detect that the application has become the background state. That is, for example, in a case of a specific application in which the background processing may be high-load processing (which is not very conceivable), it is also possible to detect that it has become the background state and execute the charge control processing just as to have become the foreground state.

Note that the specific application may be an application that is specified in advance and could execute high-load processing. Alternatively, for example, the performance or resource state of the information processing device 10 may be measured by the measurement unit 150 or the like to be described later, and an application that is executing high-load processing actually may be specified.

In addition, the detection unit 140 detects that the external power supply 90 is connected. Note that detecting that the external power supply 90 is connected includes detecting that the cable 50 to which the external power supply 90 is connected is connected as illustrated in FIG. 1.

(Measurement Unit 150)

The measurement unit 150 according to the present embodiment measures various values in the information processing device 10 based on control by the control unit 200. The measurement unit 150 according to the present embodiment measures the remaining amount of the secondary battery. In addition, the measurement unit 150 measures the temperature in the information processing device 10. Note that the temperature in the information processing device 10 includes the temperature of the CPU and the secondary battery (charging circuit) and the temperature of the back surface of the casing of the information processing device 10.

(Determination Unit 160)

The determination unit 160 according to the present embodiment determines various conditions based on control by the control unit 200. The determination unit. 160 according to the present embodiment determines whether or not the remaining amount of the secondary battery is equal to or more than a predetermined threshold. In addition, the determination unit 160 determines whether or not a specific application is in a foreground state. Note that the determination by the determination unit 160 is similar to the detection by the detection unit 140 described above that the remaining amount of the secondary battery is equal to or more than the predetermined threshold or that the specific application has become the foreground state. However, since there is a possibility that each phenomenon to be detected has already occurred at the timing of determination by the determination unit 160, the detection unit 140 cannot detect the phenomenon.

(Charge Control Unit 170)

The charge control unit 170 according to the present embodiment controls charging of the secondary battery based on control by the control unit 200. The charge control unit 170 according to the present embodiment controls charging of the secondary battery by using the external power supply 90 in response to the detection content by the detection unit 140 and the determination result by the determination unit 160.

(Control Unit 200)

The control unit 200 according to the present embodiment is a processing unit that controls the entire information processing device 10, and controls each component included in the information processing device 10. Details of functions of the control unit. 200 according to the present embodiment will be described later.

The example of the functional configuration of the information processing device 10 according to the present embodiment has been described above. Note that the functional configuration described above with reference to FIG. 2 is merely an example, and the functional configuration of the information processing device 10 according to the present embodiment is not limited to such an example. For example, the information processing device 10 may not necessarily include all of the configurations illustrated in FIG. 2, and the configuration such as the storage unit 130 or the like may be included in another device different from the information processing device 10. The functional configuration of the information processing device. 10 according to the present embodiment can be flexibly modified according to specifications and operations.

In addition, the function of each component may be performed by reading a control program from a storage medium such as a read only memory (ROM), a random access memory CRAM), or the like storing the control program in which a processing procedure in which an arithmetic device such as the CPU or the like realizes these functions is described, and interpreting and executing the program. Therefore, it is possible to appropriately change the configuration to be used according to the technical level at the time of carrying out the present embodiment. In addition, an example of a hardware configuration of the information processing device 10 will be described later.

1.2. Details of Function

Next, functions of the information processing device 10 according to the present embodiment will be described in detail. When the external power supply 90 is connected, the control unit 200 of the information processing device 10 according to the present embodiment controls each configuration described above and receives the detection content by the detection unit 140, the determination result by the determination unit 160, and the like as inputs from each configuration. One of the features of the control unit. 200 is to control charging of the secondary battery by using the external power supply 90 via the charge control unit. 170 according to the received detection content and determination result.

Figure 3A:
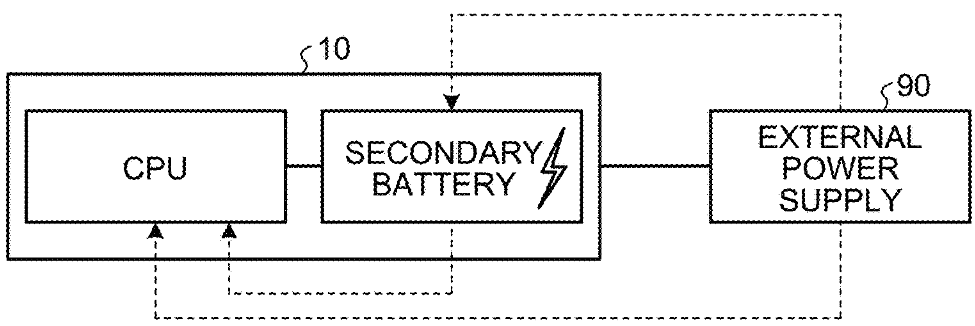
FIG. 3A is a diagram illustrating an example of a charge control mode according to the present embodiment.
Figure 3B:
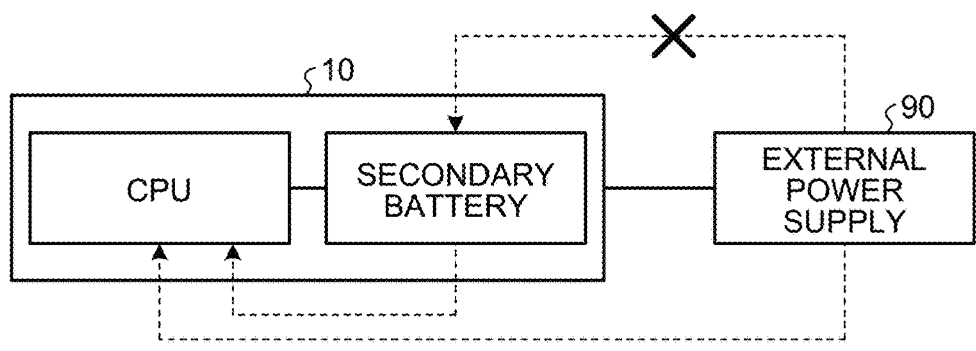
FIG. 3B is a diagram illustrating an example of the charge control mode according to the present embodiment.
Figure 3C:
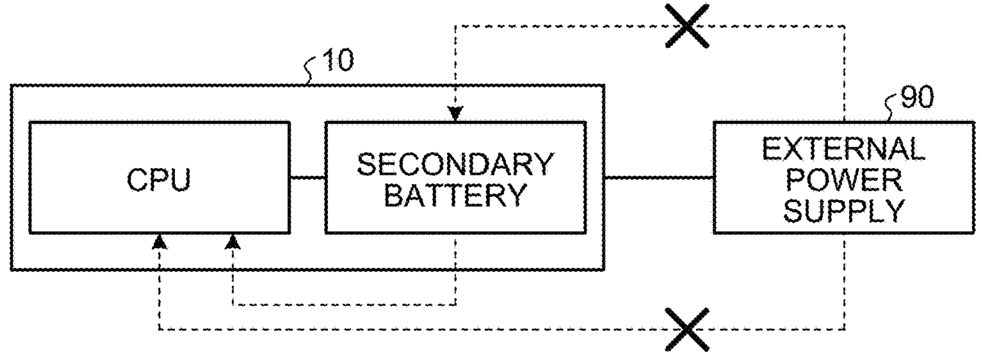
FIG. 3C is a diagram illustrating an example of the charge control mode according to the present embodiment.

FIGS. 3A to 3C are diagrams illustrating an example of a charge control mode according to the present embodiment. FIG. 3A illustrates "a charge mode". In the charge mode, both the CPU and the secondary battery of the information processing device 10 receive a power supply from the external power supply 90. This is a general aspect in a case where the external power supply 90 is connected to a device including a secondary battery, and the secondary battery is charged. Therefore, when high-load processing such as a game operation or the like is executed in the charge mode, the heat Generation due to the high-load processing and the heat generation due to charging combine to significantly increase the temperature in the device. As a resin t, the processing speed of the CPU decreases due to an increase in the internal temperature, and processing failure easily occurs.

FIG. 3B illustrates "a power supply mode". In the power supply mode, only the CPU of the information processing device 10 receives the power supply from the external power supply 90, and the secondary battery does not receive power supply (that is, it is not charged). In the power supply mode, heat due to charging is not generated, and thus the temperature in the device does not significantly increase even when the high-load processing is executed. Therefore, in a case where the high-load processing such as the game operation or the like is executed, by switching to the power supply mode, it is possible to maintain a state in which neither a decrease in the processing speed of the CPU due to the increase in the internal temperature nor processing failure occurs. In addition, in the power supply mode, since the CPU continues to receive the power supply from the external power supply 90, no charge shortage occurs, and the remaining amount of the secondary battery does not decrease in principle. However, although the external power supply 90 is connected, the remaining amount of the secondary battery does not increase because charging is not performed.

FIG. 3C illustrates "a charge cutoff mode". In the charge cutoff mode, neither the CPU nor the secondary battery of the information processing device 10 receives the power supply from the external power supply 90. In this case, since the secondary battery is not charged and the CPU continues to use the power of the secondary battery, the remaining amount of the secondary battery gradually decreases. Here, as a property of the secondary battery, it is relatively well known that so-called overcharge, continuing to receive power supply with a percentage of the remaining amount is 100%, deteriorates the secondary battery. Furthermore, as another property, maintaining a state close to full charge so that a percentage of the remaining amount is such as 100%, 95%, or the like regardless of overcharge also deteriorates the secondary battery to a considerable extent. An ideal state in which the secondary battery is less likely to deteriorate is a state in which the remaining amount always varies fluidly so as to increase or decrease between a range, for example, from 20% to 80% of the remaining amount. Therefore, when becoming a state in which the remaining amount of the secondary battery is sufficient, by switching to the charge cutoff mode, it is possible to control the remaining amount fluidly without causing overcharge and to suppress deterioration of the secondary battery.

Based on such a charge control mode, the charge control processing of the secondary battery according to the present embodiment will be described in detail. For example, in a case where the remaining amount of the secondary battery is equal to or more than a predetermined threshold. (corresponding to a first threshold) and a specific application is in a foreground state, the charge control unit 170 stops charging the secondary battery by using the external power supply 90 (power supply mode). As a result, the increase in the internal temperature is suppressed, and processing failure hardly occurs. Note that the predetermined threshold here is a threshold to the extent that a function that reduces the processing speed of the CPU, which is executed as the remaining amount of the secondary battery decreases, is not executed (for example, a percentage of the remaining amount of the secondary battery is 20%). As described above, in a case where entering the power supply mode when the remaining amount of the secondary battery is equal to or more than the predetermined threshold, the power is supplied by using the external power supply 90 to the CPU, so that the remaining amount of the secondary battery does not decrease, and the processing speed of the CPU does not decrease due to the decrease in the remaining amount of the secondary battery.

In addition, in response to detecting that the remaining amount of the secondary battery has become less than a predetermined threshold. (corresponding to the first threshold), the charge control unit 170 starts charging the secondary battery by using the external power supply 90 (switching from the power supply mode to the charge mode). That is, it is forcibly switched to the charge mode so as not to cause a decrease in the processing speed of the CPU due to the charge is running out or the remaining amount of the secondary battery is decreasing even if the high-load processing is being executed. When high-load processing is executed in the charge mode, the internal temperature significantly increases, but the charge control unit 170 switches to the power supply mode again when becoming equal to or more than a predetermined threshold, so that it is possible to suppress the increase in the internal temperature. That is, the charge control unit 170 performs the charging, during the execution of the high-load processing, at the minimum necessary to the extent that the charge does not run out or the processing speed of the CPU does not decrease. As a result, it is possible to extend the time until the processing speed of the CPU decreases due to the increase in the internal temperature.

In addition, in response to detecting that the specific application has become the sleep state or has ended, the charge control unit. 170 starts charging the secondary battery by using the external power supply 90 (switching from the power supply mode to the charge mode).

In addition, in a case where the remaining amount of the secondary battery is equal to or more than a predetermined threshold (corresponding to a second threshold), the charge control unit 170 stops charging the secondary battery by using the external power supply 90 and stops supplying power from the external power supply 90 (charge cutoff mode).

Note that the charge mode includes a normal charge mode in which general charging is performed and a quick charge mode in which the time required for charging is reduced as compared with the normal charging. In the quick charge mode, the amount of heat generated per unit time by charging is larger than that in the normal charge mode. For example, in a case where the internal temperature of the information processing device measured by the measurement unit 150 is within a predetermined range of temperature, the charge control unit 170 can perform control to charge the secondary battery by using the external power supply 90 by quick charging.

Figure 4:
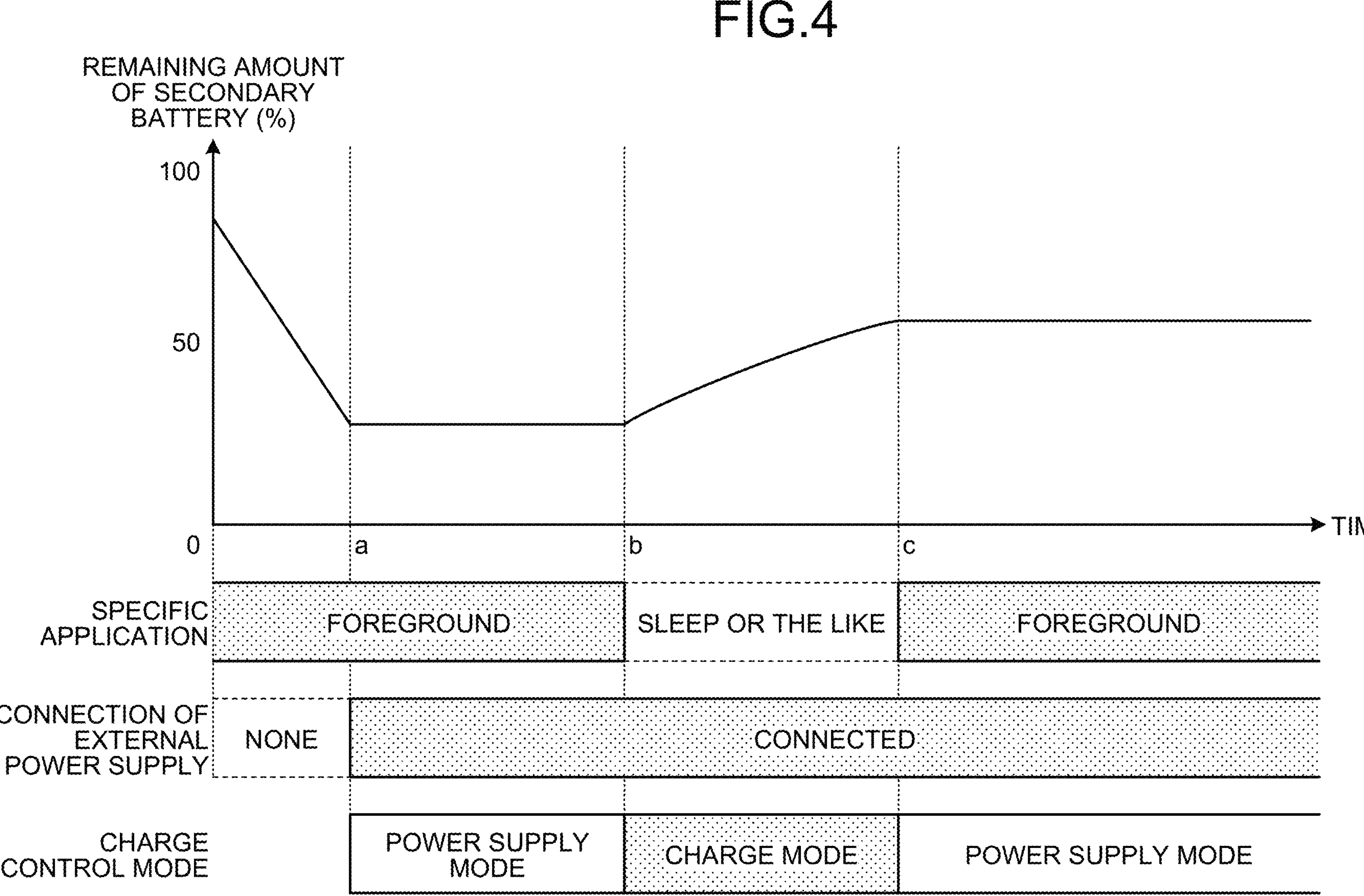
FIG. 4 is a diagram illustrating an example of switching the charge control mode according to the present embodiment.

Next, switching of the charge control mode according to the present embodiment will be described with a specific example using FIGS. 4 to 6. FIG. 4 is a diagram illustrating an example of switching the charge control mode according to the present embodiment. FIG. 4 illustrates how the charge control mode is switched depending on the state of the specific application of the high-load processing and the remaining amount of the secondary battery (similar applies to FIGS. 5 and 6 described later).

In FIG. 4, in the initial state (time 0), it is indicated that the specific application is in the foreground state and the external power supply is not yet connected. In this state, since the external power supply is not connected, the remaining amount of the secondary battery continues to decrease. In addition, since charging is not performed, no charge control mode is set.

Next, when the external power supply is connected at time a, since the specific application is in the foreground state, the charge control mode becomes the power supply mode so that the specific application and charging are not simultaneously executed. In this state, since charging is not performed, the remaining amount of the secondary battery does not increase, but since power is supplied from the external power supply to the CPU, the remaining amount of the secondary battery does not decrease (that is, the remaining amount of the secondary battery stays flat).

Next, since the specific application has become the sleep state or has ended at time b, the charge control mode becomes the charge mode. In this state, charging has been started and the remaining amount of the secondary battery continues to increase.

Next, since the specific application has become the foreground state again at time c, the charge control mode becomes the power supply mode again.

As described above, the charge control unit 170 performs control so that the specific application of the high-load processing and the charging are not simultaneously executed to suppress the increase in the internal temperature and the accompanying decrease in the processing speed of the CPU. However, when the remaining amount of the secondary battery is low at the timing of entering the power supply mode (time a in FIG. 4), the secondary battery is not charged. Therefore, there is a possibility that the decrease in the processing speed of the CPU due to the decrease in the remaining amount of the secondary battery occurs, or if the decrease in the processing speed of the CPU has already occurred, the decrease remains occurring.

Figure 5:
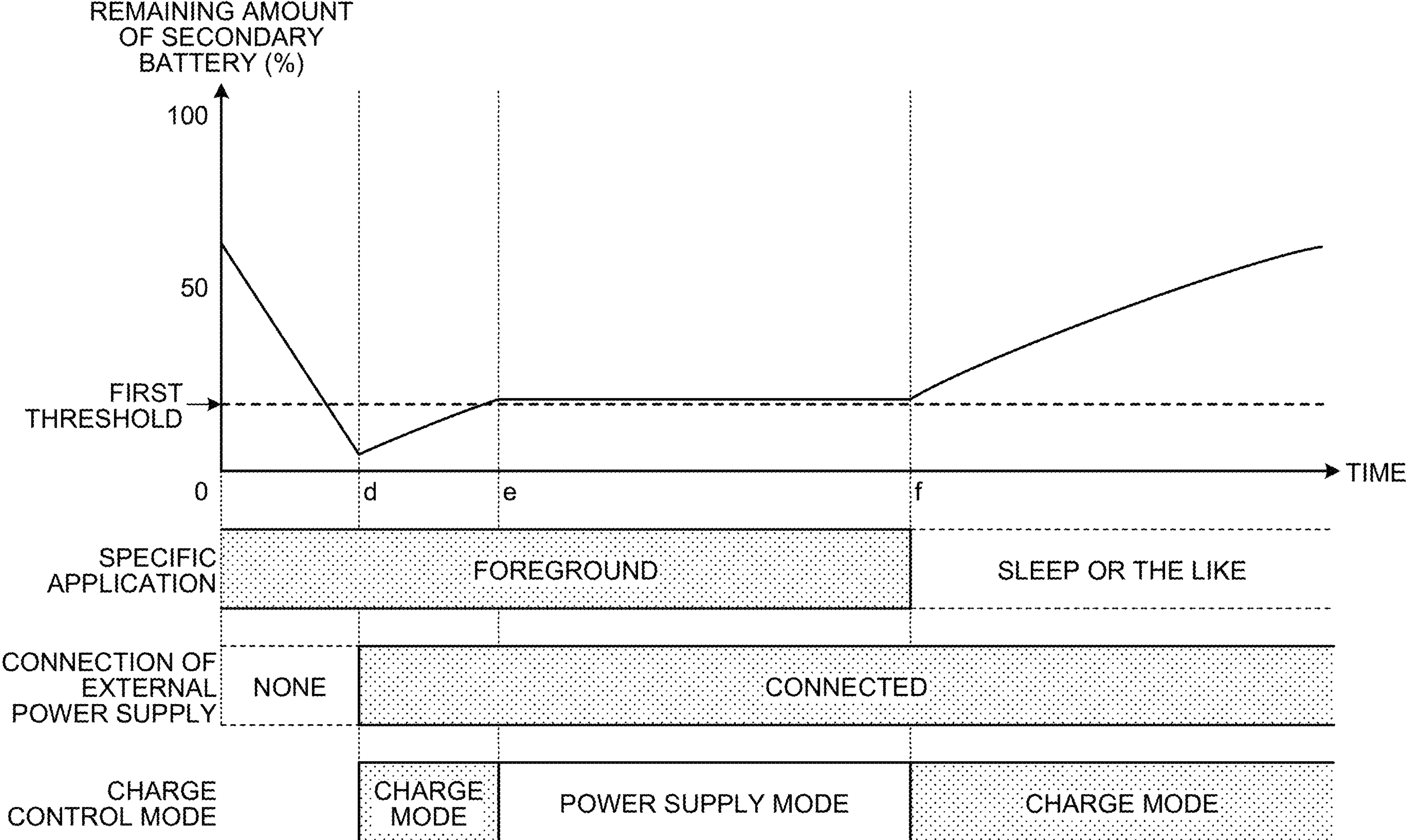
FIG. 5 is a diagram illustrating another example of switching the charge control mode according to the present embodiment.

FIG. 5 is a diagram illustrating another example of switching the charge control mode according to the present embodiment. In FIG. 5, in the initial state (time 0), it is indicated that the specific application is in the foreground state and the external power supply is not yet connected. In this state, since the external power supply is not connected, the example of FIG. 5 indicates that the remaining amount of the secondary battery continues to decrease even when the remaining amount becomes less than the first threshold. The first threshold is a boundary at which the decrease in the processing speed of the CPU due to the decrease in the remaining amount of the secondary, battery may occur when the remaining amount of the secondary battery falls below the first threshold.

Next, the external power supply is connected at time d. At time d, the specific application is in the foreground state, but if the charge control mode is switched to the power supply mode as it is, the remaining amount of the secondary battery stays flat. Therefore, there is a possibility that a state in which the remaining amount or the secondary battery remains less than the first threshold, and the decrease in the processing speed of the CPU due to the decrease in the remaining amount of the secondary battery occurs, or if the decrease in the processing speed of the CPU has already occurred, the decrease remains occurring.

Therefore, as illustrated in FIG. 5, in a case where the remaining amount of the secondary battery is less than the first threshold even when the specific application is in the foreground state, the charge control unit 170 sets the charge control mode to the charge mode. As a result, it is possible to prevent the decrease in the processing speed of the CPU from occurring due to the decrease in the remaining amount of the secondary battery, or to release the decrease in the processing speed in a case where the decrease in the processing speed has already occurred.

However, if the charge mode is continued while the specific application that is the high-load processing remains in the foreground state, the internal temperature significantly increases, and there is a possibility that the processing speed of the CPU decreases due to the increase in the internal temperature in this case. Therefore, as indicated by time e, the charge control unit 170 sets the charge control mode to the power supply mode when the remaining amount of the secondary battery has become equal to or more than the first threshold. As a result, charging of the secondary battery is stopped, and it is possible to prevent the decrease in the processing speed of the CPU due to the increase in the internal temperature from occurring. In addition, in a case where the information processing device 10 supports quick charging, it is possible to charge the secondary battery by quick charging. As a result, it is possible to eliminate the state in which the remaining amount of the secondary battery is less than the first threshold as soon as possible.

Next, when the specific application has become the sleep state or has ended at time f, the charge control unit 170 sets the charge control mode to the charge mode and starts charging the secondary battery.

As described above, switching to/from the power supply mode and the charge mode among the charge control modes has been described with specific examples. Next, switching to/from the charge cutoff mode will be described. FIG. 6 is a diagram illustrating yet another example of switching the charge control mode according to the present embodiment.

Figure 6:
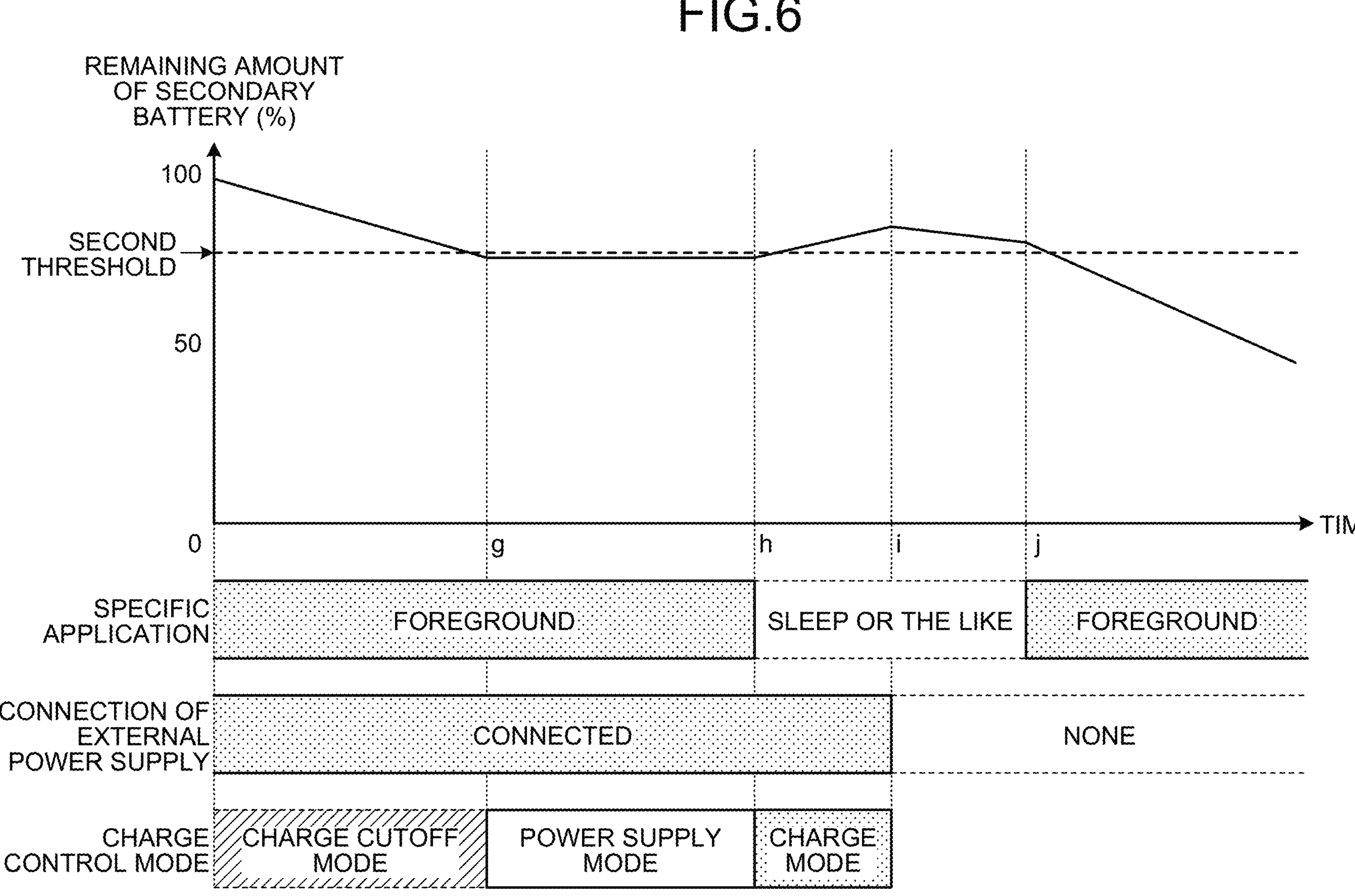
FIG. 6 is a diagram illustrating yet another example of switching the charge control mode according to the present embodiment.

In FIG. 6, in the initial state (time 0), it is indicated that the specific application is in the foreground state and the external power supply is connected. However, the remaining amount of the secondary battery exceeds the second threshold, and as described above, if this state continues, the secondary battery may be deteriorated due to overcharge or the like. Therefore, the charge control unit 170 sets the charge control mode to the charge cutoff mode. As a result, it is possible to control the remaining amount fluidly without causing overcharge, and it is possible to suppress deterioration of the secondary battery.

Therefore, as indicated by time g, the charge control unit 170 sets the charge control mode to the power supply mode when the remaining amount of the secondary battery has become less than the second threshold. As a result, it is possible to suppress the deterioration of the secondary battery while sufficiently maintaining the remaining amount of the secondary battery.

Next, when the specific application has become the sleep state or has ended at time h, the charge control unit 170 sets the charge control mode to the charge mode and starts charging the secondary battery. Thereafter, when releasing the connection of the external power supply at time 1, the remaining amount of the secondary battery decreases with time.

1.3. Flow of Function

Figure 7:
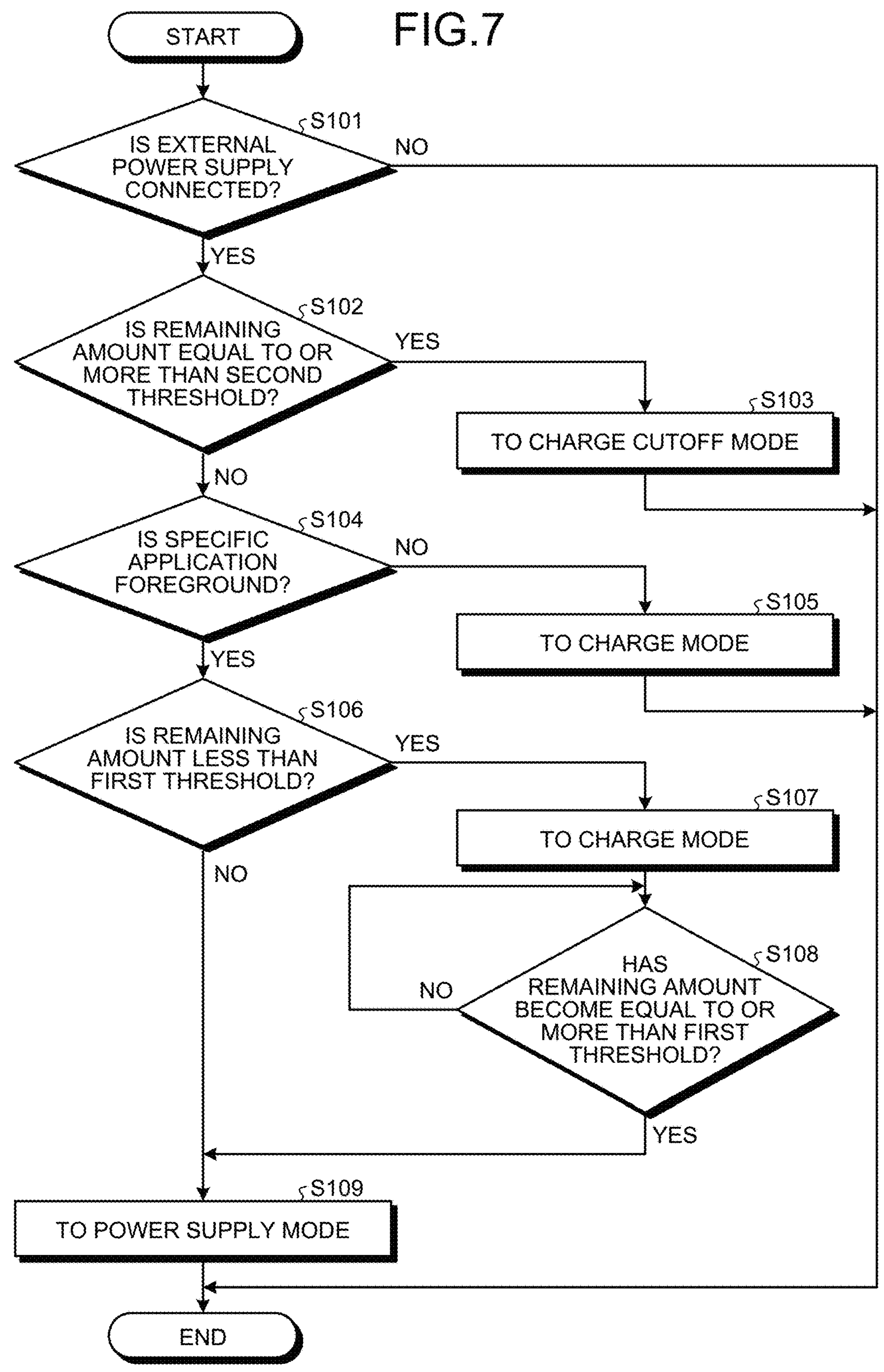
FIG. 7 is a flowchart illustrating a flow of charge control processing according to the embodiment.

Next, a procedure of charge control processing according to the present embodiment will be described with reference to FIG. 7. FIG. 7 is a flowchart illustrating a flow of the charge control processing according to the present embodiment. This processing is the processing of controlling the charging of the secondary battery by switching the charge control mode based on the state of the specific application of high-load processing or the remaining amount of the secondary battery.

Figure 8:
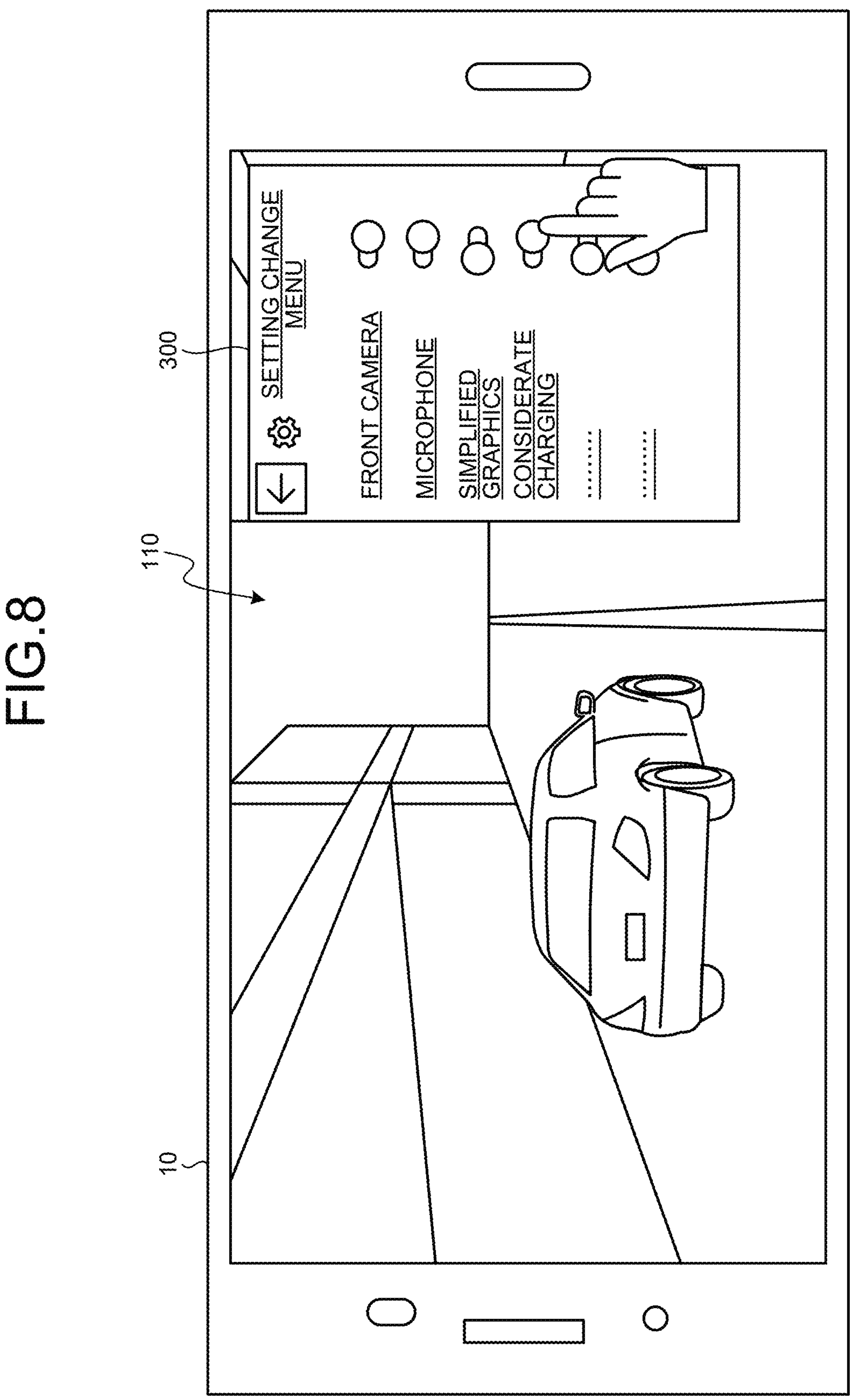
FIG. 8 is a diagram illustrating an example of a setting change menu according to the present embodiment.

This processing starts, for example, in a case where a user indicates an intention to use a function of controlling charging according to the present embodiment. FIG. 8 is a diagram illustrating an example of a setting change menu according to the present embodiment. FIG. 8 illustrates a setting change menu 300 so as to be displayed in a superimposing manner on the specific application displayed on the display unit 110 of the information processing device 10. For example, on the setting change menu 300, the user indicates an intention to use the function of controlling charging according- to the present embodiment ("considerate charging" in the example of FIG. 8) by turning on a switch for use. As a result, the processing illustrated in FIG. 7 starts.

As illustrated in FIG. 7, first, in a case where the external power supply 90 is not connected to the information processing device 10 (Step S101: No), this processing ends. In this case, for example, thereafter, by using the connection of the external power supply 90 as a trigger, this processing can start from Step S101: Yes.

On the other hand, in a case where the external power supply 90 is connected to the information processing device 10 (Step 3101: Yes), the information processing device 10 determines whether or not the remaining amount of the secondary battery is equal to or more than the second threshold. (Step S102). Here, the second threshold is, as illustrated in FIG. 6, a boundary at which the secondary battery may be deteriorated due to overcharge or the like when the state in which exceeding the second threshold continues.

In a case where the remaining amount of the secondary battery is equal to or more than the second threshold. (Step S102: Yes), the information processing device 10 sets the charge control mode to the charge cutoff mode (Step S103). As a result, power from the external power supply 90 is not supplied to both the CPU and the secondary battery of the information processing device 10, the CPU uses the power of the secondary battery, and the remaining amount gradually decreases. After Step S103, this processing ends, but for example, thereafter, this processing can start from Step S102: No by using a condition that the remaining amount of the secondary battery has become less than the second threshold as a trigger.

On the other hand, in a case where the remaining amount of the secondary battery is not equal to or more than the second threshold (Step S102: No), the information processing device 10 determines whether or not the specific application is in the foreground state (Step S104).

In a case where the specific application is not in the foreground state (Step S104: No), the information processing device 10 sets the charge control mode to the charge mode (Step S105). As a result, charging of the secondary battery starts. After Step S105, this processing ends, but for example, thereafter, the charge control mode can be switched to the charge cutoff mode by using a condition that the remaining amount of the secondary, battery has become equal to or more than the second threshold as a trigger.

On the other hand, in a case where the specific application is in the foreground state (Step S104. Yes), the information processing device 10 determines whether or not the remaining amount of the secondary battery is less than the first threshold (Step S106). Here, the first threshold is, as illustrated in FIG. 5, a boundary at which the decrease in the processing speed of the CPU due to the decrease in the remaining amount of the secondary battery may occur when falling below the first threshold.

In a case where the remaining amount of the secondary battery is less than the first threshold (Step S106: Yes), the information processing device 10 sets the charge control mode to the charge mode (Step S107). As a result, although the specific application is in the foreground state, the charging of the secondary battery starts.

However, if the charge mode is continued while the specific application remains in the foreground state, there is a possibility that the processing speed of the CPU decreases due to the increase in the internal temperature, and thus, the information processing device 10 determines whether or not the remaining amount of the secondary battery has become equal to or more than the first threshold (Step S108). To be exact, the remaining amount of the secondary battery is periodically measured and monitored, and it is detected that the remaining amount has become equal to or more than the first threshold.

In a case where the remaining amount of the secondary battery has not become equal to or more than the first threshold. (Step S108: No), the information processing device 10 waits until the remaining amount of the secondary battery becomes equal to or more than the first threshold. In a case where the remaining amount of the secondary battery is equal to or more than the first threshold (Step S108: Yes), the information processing device 10 sets the charge control mode to the power supply mode (Step S109). As a result, the charging of the secondary battery stops, and the increase in the internal temperature is suppressed.

On the other hand, in a case where the remaining amount of the secondary battery is not less than the first threshold. (step S106: No), the information processing device 10 sets the charge control mode to the power supply mode (Step S109). As a result, the specific application and the charging are not simultaneously executed, and the increase in the internal temperature is suppressed. After Step S109, this processing ends.

Figure 9:
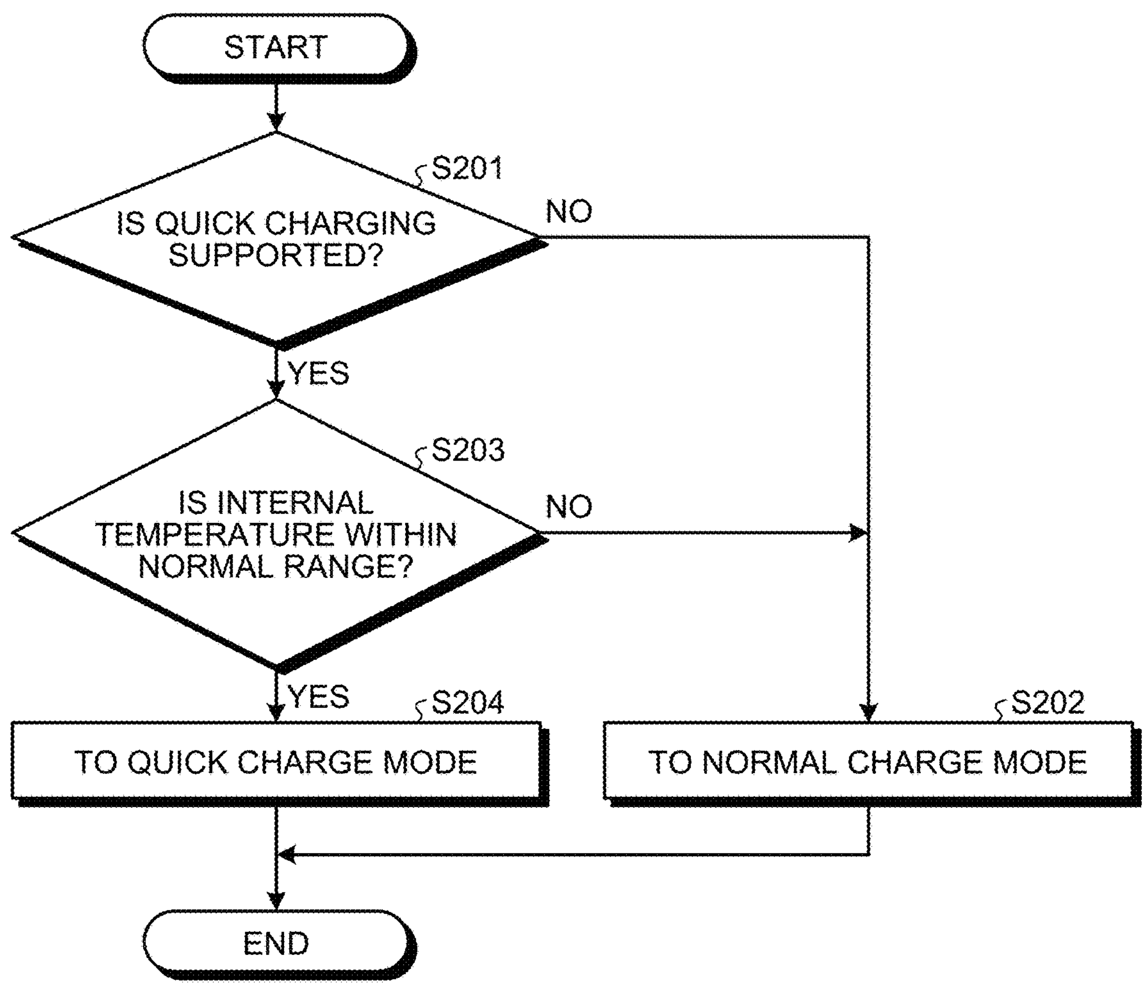
FIG. 9 is a flowchart illustrating a flow of charge mode selection processing according to the present embodiment.

Next, a procedure of charge mode selection processing according to the present embodiment will be described. FIG. 9 is a flowchart illustrating a flow of the charge mode selection processing according to the present embodiment. In a case where the information processing device 10 supports quick charging, it is possible to charge the secondary battery by quick charging. Therefore, in the charge control processing illustrated in FIG. 7, when the charge control mode is set to the charge mode (Steps S105 and S107), it is possible to select whether to set the quick charge mode or the normal charge mode.

As illustrated in FIG. 9, first, the information processing device 10 determines whether or not the information processing device 10 supports quick charging (Step S201).

In a case where quick charging is not supported (Step S201: No), the information processing device 10 selects the normal charge mode (Step S202).

On the other hand, in a case where quick charging is supported (Step S201: Yes), the information processing device 10 determines whether or not the internal temperature is within a normal temperature range (Step S203). Here, the normal temperature can be set in advance.

In a case where the internal temperature is not within the normal temperature range (Step S203: No), the information processing device TO selects the normal charge mode (Step S202).

On the other hand, in a case where the internal temperature is within the normal temperature range (Step S203: Yes), the information processing device 10 selects the quick charge mode (Step S204). After Step S202 or S204, this processing ends.

2. Modification. Example of Embodiment

Figure 10:
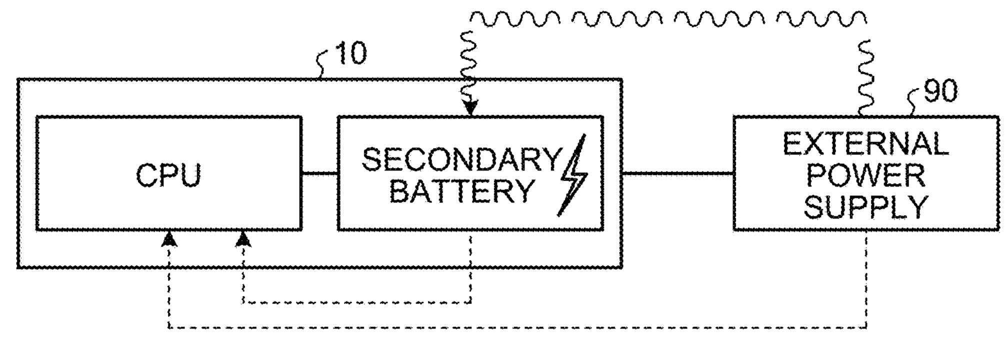
FIG. 10 is a diagram illustrating a modification example of the charge control mode according to the present embodiment.

Next, a modification example of the embodiment will be described. FIG. 10 is a diagram illustrating a modification example of the charge control mode according to the present embodiment. FIG. 10 illustrates "a light charge mode". In the light charge mode, similar to the charge mode, both the CPU and the secondary battery of the information processing device 10 receive the power supply from the external power supply 90. However, the amount of charging the secondary battery is suppressed.

A use scene of the light charge mode is, for example, a case where the user is playing a specific application of high-load processing, and since the user goes out or the like after a while, the user does not plan to play for a long time and wants to charge the secondary battery a little. Since the amount of charging the secondary battery is suppressed in the light charge mode, heat generation due to the charging is also suppressed (since heat is generated, in case of continuing playing as it is, the decrease in the processing speed of the CPU due to the increase in the internal temperature occurs).

Figure 11:
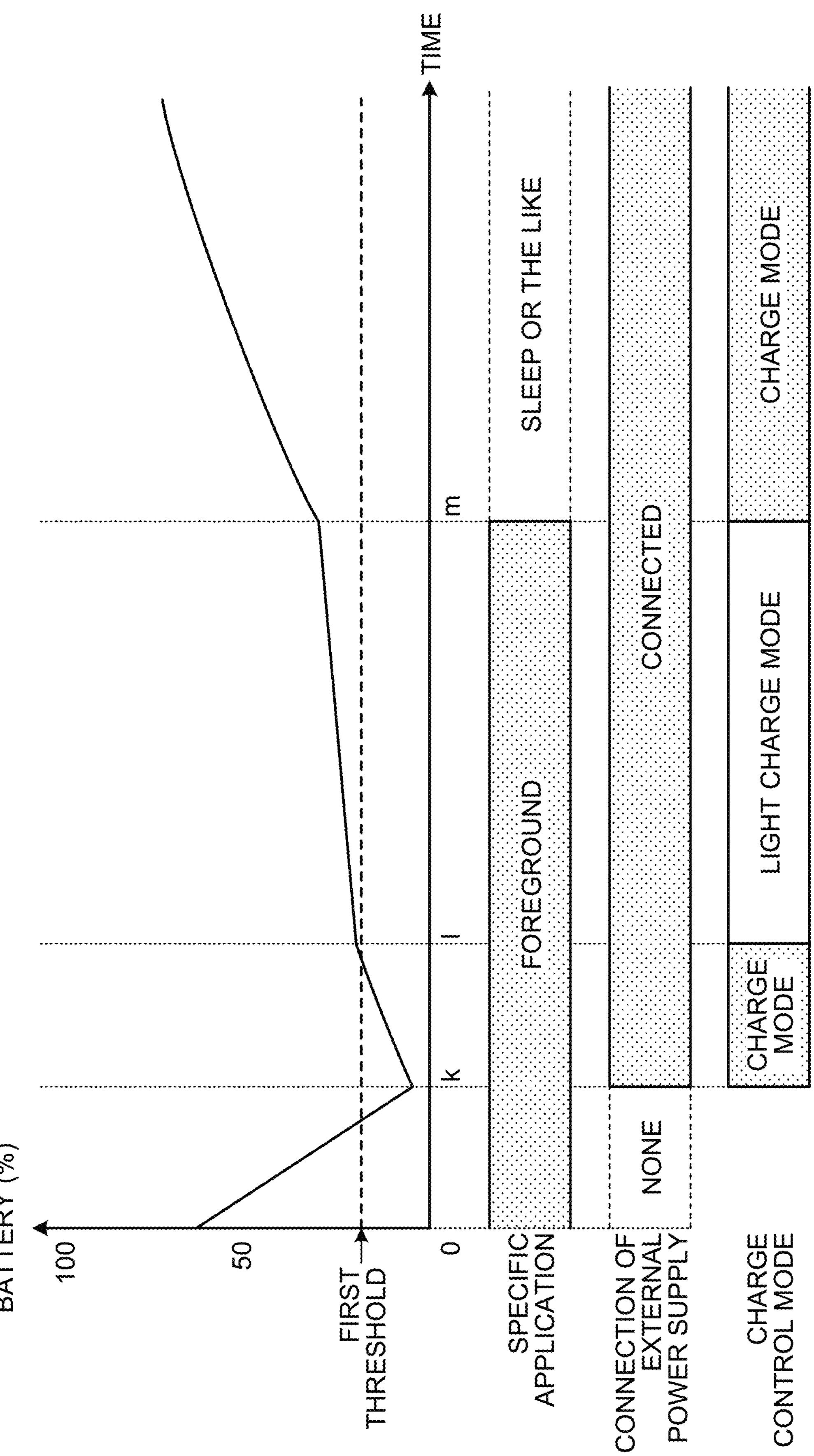
FIG. 11 is a diagram illustrating a modification example of switching the charge control mode according to the present embodiment.

FIG. 11 is a diagram illustrating a modification example of switching the charge control mode according to the present embodiment. In FIG. 11, similar to FIG. 5, until the remaining amount of the secondary battery becomes equal to or more than the first threshold (time 1), the secondary battery is charged in the charge mode in order to prevent or eliminate the occurrence of the decrease in the processing speed of the CPU due to the decrease in the remaining amount of the secondary battery. However, after the remaining amount of the secondary battery has become equal to or more than the first threshold. (time 1), the charge control mode is set to the light charge mode, and the secondary battery is charged little by little. Note that, in the light charge mode also, when the specific application has become the sleep state or has ended (time m), the charge control mode is switched to the charge mode, and the suppression of the amount of charging the secondary battery is released.

3. Example of Hardware Configuration

Figure 12:
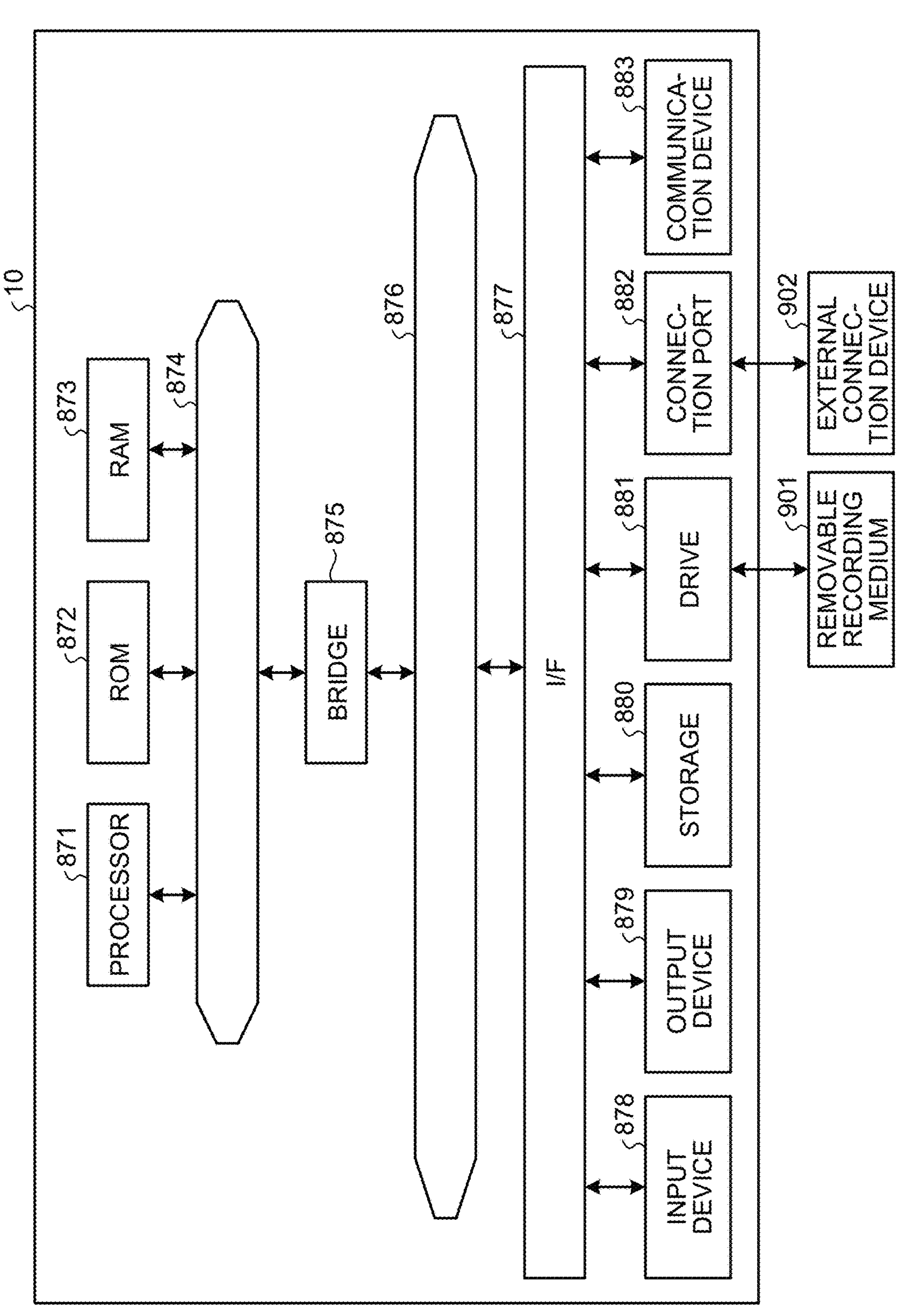
FIG. 12 is a block diagram illustrating an example of a hardware configuration of the information processing device 10 according to the present embodiment.

Next, an example of a hardware configuration of the information processing device 10 according to an embodiment of the present disclosure will be described. FIG. 12 is a block diagram illustrating an example of a hardware configuration of the information processing device 10 according to the present embodiment. Referring to FIG. 12, the information processing device 10 includes, for example, a processor 871, a ROM 872, a RAM 873, a host bus 874, a bridge 875, an external bus 876, an interface 877, an input device 878, an output device 879, a storage 880, a drive 881, a connection port 882, and a communication device 883. Note that the hardware configuration described here is an example, and some of the components may be omitted. In addition, a component other than the components described here may be further included.

(Processor 871)

The processor 871 functions as, for example, an arithmetic processing device or a control device, and controls the overall operation of each component or a part thereof based on various programs recorded in the ROM 872, the PAM 873, the storage 880, or a removable recording medium 901.

(Rom 872, Ram 873)

The ROM 872 is a unit that stores a program read by the processor 871, data used for calculation, and the like. The RAM 873 temporarily or permanently stores, for example, a program read by the processor 871, various parameters that are appropriately changed when the program is executed, and the like.

(Host Bus 874, Bridge 875, External Bus 876, Interface 877)

The processor 871, the ROM 872, and the RAM 873 are mutually connected via the host bus 874 capable of high-speed data transmission, for example. On the other hand, the host bus 874 is connected to the external bus 876 having a relatively low data transmission speed via the bridge 875, for example. In addition, the external bus 876 is connected to various components via the interface 877.

(Input Device 878)

As the input device 878, for example, a mouse, a keyboard, a touch panel, a button, a switch, a lever, and the like are used. Furthermore, as the input device 878, a remote controller (hereinafter, referred to as a remote controller) capable of transmitting a control signal using infrared rays or other radio waves may be used. In addition, the input device 878 includes a voice input device such as a microphone and the like.

(Output Device 879)

The output device 879 is, for example, a device capable of visually or audibly notifying the user of acquired information, such as a display device such as a cathode ray tube (CRT), a liquid crystal display (LCD), an organic electroluminescent (EL), or the like, an audio output device such as a speaker, a headphone, or the like, a printer, a mobile phone, a facsimile, or the like. In addition, the output device 879 according to the present disclosure includes various vibration devices capable of outputting tactile stimulation.

(Storage 880)

The storage 880 is a device for storing various data. As the storage 880, for example, a magnetic storage device such as a hard disk drive (HDD) and the like, a semiconductor storage device, an optical storage device, a magneto-optical storage device, or the like is used.

(Drive 881)

The drive 881 is, for example, a device that reads information recorded on the removable recording medium 901 such as a magnetic disk, an optical disk, a magneto-optical disk, a semiconductor memory, or the like or writes information to the removable recording medium 901.

(Removable Recording Medium 901)

The removable recording medium 901 is, for example, a DVD medium, a Blu-ray (registered trademark) medium, a HD DVD medium, various semiconductor storage media, or the like. Of course, the removable recording medium 901 may be, for example, an IC card on which a non-contact IC chip is mounted, an electronic device, or the like.

(Connection Port 882)

The connection port 882 is a port such as a universal serial bus (USB) port, an IEEE 1394 port, a small computer system interface (SCSI), a RS-232 C port, an optical audio terminal, or the like for connecting an external connection device 902.

(External Connection Device 902)

The external connection device 902 is, for example, a printer, a portable music player, a digital camera, a digital video camera, an IC recorder, or the like.

(Communication Device 883)

The communication device 883 is a communication device for connecting to a network, and is, for example, a communication card for wired or wireless LAN, Bluetooth (registered trademark), or wireless USB (WUSB), a router for optical communication, a router for asymmetric digital subscriber line (ADSL), a modem for various types of communication, or the like.

4. Summary

As described above, an information processing device (10) including a secondary battery includes a measurement unit (150) that measures a remaining amount of the secondary battery, a determination unit (160) that determines whether or not the remaining amount is equal to or more than a first threshold and determines whether or not a specific application is in a foreground state, and a charge control unit (170) that stops charging the secondary battery by using an external power supply in a case where the remaining amount is equal to or more than the first threshold and the specific application is in the foreground state.

As a result, it is possible to maintain, as long as possible, the state in which the decrease in the processing speed of the CPU due to heat generation hardly occurs.

The preferred embodiments of the present disclosure have been described above in detail with reference to the accompanying drawings, but the technical scope of the present disclosure is not limited to such examples. It is obvious that a person having ordinary knowledge in the technical field of the present disclosure can conceive various changes or modifications within the scope of the technical idea described in the claims, and it is naturally understood that these also belong to the technical scope of the present disclosure.

In addition, the effects described in the present specification are merely illustrative or exemplary, and are not restrictive. That is, the technology according to the present disclosure can exhibit other effects obvious to those skilled in the art from the description of the present specification together with or instead of the above effects.

Note that the present technology can also have the following configurations.

(1)

An information processing device including a secondary battery, the information processing device comprising:

a measurement unit that measures a remaining amount of the secondary battery;

a determination unit that determines whether or not the remaining amount is equal to or more than a first threshold and determines whether or not a specific application is in a foreground state; and a charge control unit that stops charging the secondary battery by using an external power supply in a case where the remaining amount is equal to or more than the first threshold and the specific application is in the foreground state.

(2)

The information processing device according to (1), further comprising a detection unit that detects that the remaining amount has become less than the first threshold, wherein the charge control unit further starts charging the secondary battery by using the external power supply in response to a detection that the remaining amount has become less than the first threshold.

(3)

The information processing device according to (1) or (2) further comprising a detection unit that detects that the specific application has become a sleep state or has ended, wherein the charge control unit further starts charging the secondary battery by using the external power supply in response to a detection that the specific application has become the sleep state or has ended.

(4)

The information processing device according to any one of (1) to (3), further comprising a detection unit that detects that the remaining amount has become equal to or more than the first threshold, wherein a determination, by the determination unit, of whether or not the specific application is in the foreground state is executed in response to a detection that the remaining amount has become equal to or more than the first threshold.

(5)

The information processing device according to any one of (1) to (4), further comprising a detection unit that detects that the specific application has become the foreground state, wherein a determination, by the determination unit, of whether or not the remaining amount has become equal to or more than, the first threshold is executed in response to a detection that the specific application has become the foreground state.

(6)

The information processing device according to any one of (1) to (5), further comprising an operation unit that detects a predetermined operation by a user, wherein.

a determination, by the determination unit, of whether or not the remaining amount has become equal to or more than the first threshold and a determination, by the determination unit, of whether or not the specific application is in the foreground state are executed in response to a detection of the predetermined operation by the user.

(7)

The information processing device according to any one of (1) to (6), further comprising a detection unit that detects that the external power supply is connected, wherein a determination, by the determination unit, of whether or not the remaining amount has become equal to or more than the first threshold and a determination, by the determination unit, of whether or not the specific application is in the foreground state are executed in response to a detection that the external power supply is connected.

(8)

The information processing device according to any one of (1) to (7), wherein the determination unit further determines whether or not the remaining amount is equal to or more than a second threshold which is a value higher than the first threshold, and the charge control unit further stops charging the secondary battery by using the external power supply and stops supplying power from the external power supply in a case where the remaining amount is equal to or more than the second threshold.

(9)

The information processing device according to (8), further comprising a detection unit that detects that the remaining amount has become less than the second threshold, wherein a determination, by the determination unit, of whether or not the specific application is in the foreground state is executed in response to a detection that the remaining amount has become less than the second threshold.

(10)

The information processing device according to any one of (1) to (9), wherein the measurement unit further measures a temperature in the information processing device, and a charging, by the charge control unit, or the secondary battery by using the external power supply is performed by quick charging in a case where the temperature is within a predetermined range of temperature.

(11)

A program for causing an information processing device including a secondary battery to execute processing of:

measuring a remaining amount of the secondary battery;

determining whether or not the remaining amount is equal to or more than a first threshold;

determining whether or not a specific application is in a foreground state; and stopping charging the secondary battery by using an external power supply in a case where the remaining amount is equal to or more than the first threshold and the specific application is in the foreground state.

(12)

A method in which an information processing device including a secondary battery executes processing of:

measuring a remaining amount of the secondary battery;

determining whether or not the remaining amount is equal to or more than a first threshold;

determining whether or not a specific application is in a foreground state; and stopping charging the secondary battery by using an external power supply in a case where the remaining amount is equal to or more than the first threshold and the specific application is in the foreground state.

REFERENCE SIGNS LIST

10 INFORMATION PROCESSING DEVICE
50 CABLE
90 EXTERNAL POWER SUPPLY
110 DISPLAY UNIT
120 OPERATION UNIT
130 STORAGE UNIT
140 DETECTION UNIT
150 MEASUREMENT UNIT
160 DETERMINATION UNIT
170 CHARGE CONTROL UNIT
200 CONTROL UNIT

The invention claimed is:

1. An information processing device including a secondary battery, the information processing device comprising:

processing circuitry configured to:

measure a remaining amount of charge of the secondary battery;

determine whether or not the remaining amount of charge is equal to or more than a first threshold;

determine whether or not a specific application is in a foreground state;

automatically stop charging of the secondary battery from an external power supply while the processing circuitry continues to receive power from the external power supply based on a determination that the remaining amount of charge is equal to or more than the first threshold and the specific application is in the foreground state;

continuously maintain the stop of the charging of the secondary battery from the external power supply for a duration that the specific application is in the foreground state and the remaining amount of charge is equal to or more than the first threshold; and automatically resume charging of the secondary battery from the external power supply in response to a determination that the specific application has become a sleep state or has ended, or a determination that the remaining amount of charge has become less than the first threshold.

2. The information processing device according to claim 1, wherein the processing circuitry is configured to:

detect that the remaining amount of charge has become equal to or more than the first threshold, and determine whether or not the specific application is in the foreground state in response to a detection that the remaining amount of charge has become equal to or more than the first threshold.

3. The information processing device according to claim 1, wherein the processing circuitry is configured to:

detect that the specific application has become the foreground state, and determine whether or not the remaining amount of charge has become equal to or more than the first threshold in response to a detection that the specific application has become the foreground state.

4. The information processing device according to claim 1, wherein the processing circuitry is configured to:

detect a predetermined operation by a user, and determine whether or not the remaining amount of charge has become equal to or more than the first threshold and determine whether or not the specific application is in the foreground state in response to a detection of the predetermined operation by the user.

5. The information processing device according to claim 1, wherein the processing circuitry is configured to:

detect that the external power supply is connected, and determine whether or not the remaining amount of charge has become equal to or more than the first threshold and determine whether or not the specific application is in the foreground state in response to a detection that the external power supply is connected.

6. The information processing device according to claim 1, wherein the processing circuitry is configured to:

determine whether or not the remaining amount of charge is equal to or more than a second threshold which is a value higher than the first threshold, and stop charging the secondary battery from the external power supply and stop supplying power from the external power supply in a case where the remaining amount of charge is equal to or more than the second threshold.

7. The information processing device according to claim 6, wherein the processing circuitry is configured to:

detect that the remaining amount of charge has become less than the second threshold, and determine whether or not the specific application is in the foreground state in response to a detection that the remaining amount of charge has become less than the second threshold.

8. The information processing device according to claim 1, wherein the processing circuitry is configured to:

measure a temperature in the information processing device, and perform a quick charging in a case where the temperature is within a predetermined range of temperature.

9. The information processing device according to claim 1, wherein the processing circuitry is configured to start charging the secondary battery from the external power supply in response to a detection that the remaining amount of charge has become less than the first threshold regardless of whether the specific application is in the foreground state.

10. The information processing device according to claim 1, wherein the processing circuitry is configured to start charging the secondary battery from the external power supply in response to a detection that the remaining amount of charge has become less than the first threshold while the specific application is in the foreground state.

11. The information processing device according to claim 6, wherein the processing circuitry is configured to stop charging the secondary battery from the external power supply and stops stop supplying power from the external power supply in a case where the remaining amount of charge is equal to or more than the second threshold regardless of whether the specific application is in the foreground state.

12. The information processing device according to claim 1, wherein the processing circuitry is configured to determine whether or not a specific application is in a foreground state according to a user selected setting.

13. The information processing device according to claim 1, wherein the processing circuitry is configured to select between a quick charge mode and a normal charge mode when charging the secondary battery based on a temperature in the information processing device.

14. The information processing device according to claim 1, wherein the processing circuitry is configured to maintain the measured remaining amount of charge of the secondary battery in a substantially flat state during the duration that the specific application is in the foreground state.

15. The information processing device according to claim 1, wherein the processing circuitry is configured to automatically switch from a charge mode to a power supply mode in response to a determination that the specific application has entered the foreground state, and in the power supply mode, the processing circuitry receives the power from the external power supply and the secondary battery does not receive power from the external power supply.

16. The information processing device according to claim 1, wherein the processing circuitry is configured to specify the specific application by measuring a resource state of the information processing device to identify an application executing high-load processing.

17. A non-transitory computer readable medium storing a program for causing an information processing device including processing circuitry and a secondary battery to perform a method, the method comprising:

measuring a remaining amount of charge of the secondary battery;

determining whether or not the remaining amount of charge is equal to or more than a first threshold;

determining whether or not a specific application is in a foreground state;

automatically stopping charging of the secondary battery from an external power supply while the processing circuitry continues to receive power from the external power supply based on a determination that the remaining amount of charge is equal to or more than the first threshold and the specific application is in the foreground state;

continuously maintaining the stop of the charging of the secondary battery from the external power supply for a duration that the specific application is in the foreground state and the remaining amount of charge is equal to or more than the first threshold; and automatically resuming charging of the secondary battery from the external power supply in response to a determination that the specific application has become a sleep state or has ended, or a determination that the remaining amount of charge has become less than the first threshold.

18. A method for an information processing device including processing circuitry and a secondary battery, the method comprising:

measuring a remaining amount of charge of the secondary battery;

determining whether or not the remaining amount of charge is equal to or more than a first threshold;

determining whether or not a specific application is in a foreground state;

automatically stopping charging of the secondary battery from an external power supply while the processing circuitry continues to receive power from the external power supply based on a determination that the remaining amount of charge is equal to or more than the first threshold and the specific application is in the foreground state;

continuously maintaining the stop of the charging of the secondary battery from the external power supply for a duration that the specific application is in the foreground state and the remaining amount of charge is equal to or more than the first threshold; and automatically resuming charging of the secondary battery from the external power supply in response to a determination that the specific application has become a sleep state or has ended, or a determination that the remaining amount of charge has become less than the first threshold.

* * * * *